United States Patent [19]

Haymaker

[11] 4,456,876
[45] Jun. 26, 1984

[54] FREQUENCY COUNTER

[75] Inventor: James R. Haymaker, Winston-Salem, N.C.

[73] Assignee: AT&T Technologies, Inc., New York, N.Y.

[21] Appl. No.: 388,307

[22] Filed: Jun. 14, 1982

[51] Int. Cl.³ ............................................. G01R 23/16
[52] U.S. Cl. .............................. 324/77 R; 324/78 R; 324/78 D; 377/52
[58] Field of Search ............... 324/77 R, 77 B, 77 E, 324/78 R, 78 D, 78 E, 79 D, 79 R, 140 R; 377/39, 52, 54

[56] References Cited

U.S. PATENT DOCUMENTS

| | | | |
|---|---|---|---|
| 2,309,481 | 1/1943 | Summerhayes, Jr. | 250/17 |
| 3,806,808 | 4/1974 | Willmore | 324/78 R |
| 3,838,338 | 9/1974 | Khoury | 324/79 D |
| 3,917,927 | 11/1975 | Minton | 235/92 TF |
| 3,997,764 | 12/1976 | Belmonte et al. | 377/39 |
| 4,020,418 | 4/1977 | Burrage | 324/78 D |
| 4,130,799 | 12/1978 | Cherry | 324/79 D |
| 4,139,819 | 2/1979 | Worley | 324/79 D |
| 4,215,308 | 7/1980 | Kusters | 324/78 D |
| 4,257,003 | 3/1981 | Yool | 324/78 D |
| 4,326,256 | 4/1982 | Furumorto | 377/39 |

Primary Examiner—Michael J. Tokar
Assistant Examiner—B. J. Kelley
Attorney, Agent, or Firm—J. B. Hoofnagle; H. St. Julian

[57] ABSTRACT

A frequency counter (20) measures and displays a plurality of frequencies appearing on input channels (22, 24, 26 and 28) of an analog circuit (30). A program switch (32) is coupled to a decoder logic circuit (34) which facilitates the operation of counter (20) in one of a plurality of selectable program modes. A steering logic circuit (36) is coupled to circuit (34) and facilitates the selection and order of the input channels (22, 24, 26 and 28) during a measurement cycle. Toggle switches (38, 40 and 42) are coupled to circuit (36) to facilitate the establishment of a sign bit, a channel order and a channel select, respectively. A channel display circuit (46) provides visual indication of the sign, channel select and channel order.

12 Claims, 14 Drawing Figures

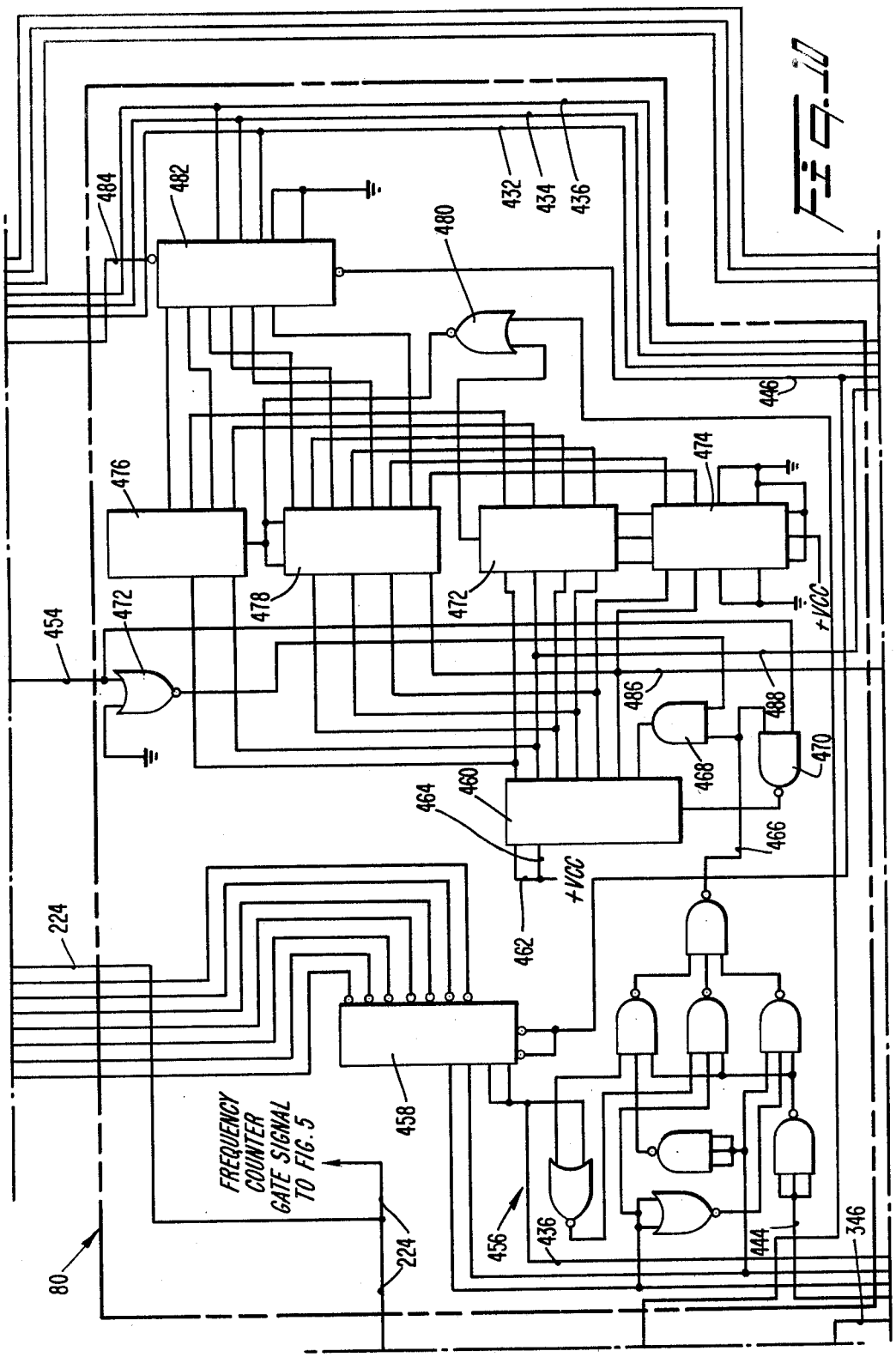

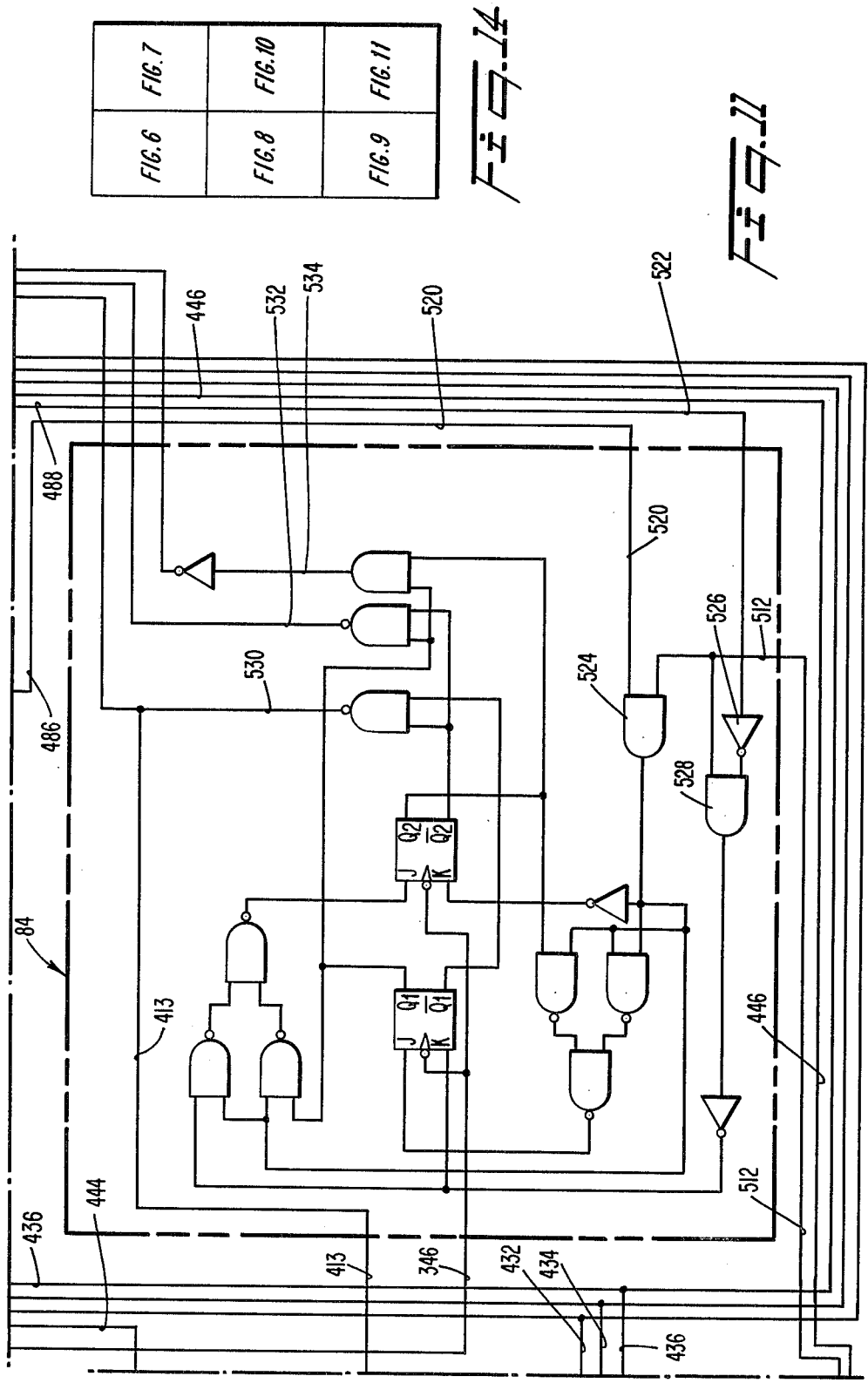

FREQUENCY COUNTER

TECHNICAL FIELD

This invention relates to a frequency counter and more particularly to a frequency counter which is capable of being programmed to measure a plurality of frequencies independently of each other or as a sum or a difference of any of the plurality of frequencies.

BACKGROUND OF THE INVENTION

In transmitting radio signals in a single sideband suppressed carrier mode, all of the transmitted power is in the intelligence carrying sideband. In order to generate the single sideband suppressed carrier frequency signal, a carrier signal is modulated, with a known frequency signal, using a balanced modulator. The balanced modulator will produce an upper sideband and a lower sideband. The upper and lower sidebands are fed to a filter circuit which facilitates the elimination of an undesired sideband. Thereafter, a transmit frequency of the desired sideband may be increased or decreased by utilizing heterodyne action. Heterodyne action is facilitated by feeding the desired sideband into a mixer circuit along with a known frequency signal. Thus, in order to increase or decrease the transmit frequency of the sideband, a plurality of mixer circuits may be used. Each of the mixer circuits produce sum and difference frequencies. Resonant circuits are used to eliminate the undesired sum or difference frequencies. Therefore, the transmit frequency of the sideband, which is ultimately forwarded to the antenna, may consist of the sum and/or the difference of a plurality of intermediate frequencies. In order to determine the transmit frequency of the sideband generated by a transmitter having a plurality of mixer stages, a frequency counter is utilized. Some frequency counters are designed to operate only with transmitters having the sum and/or difference of the intermediate frequencies in a predetermined order. If the order is changed, the counter will not operate properly.

Consequently, there is a need for a frequency counter which is flexible and can be reconfigured to accommodate the order of combining frequencies by any transmitter.

SUMMARY OF THE INVENTION

This invention relates to a frequency counter. The frequency counter includes (1) means for feeding a plurality of frequency signals, which are to be measured, to the frequency counter, (2) means for programming the operation of the frequency counter, (3) means, enabled during a first gate time, for generating a count which is representative of the frequency of the signals measured, (4) means for storing the count generated by the establishing means, (5) means for detecting whether the count generated by the generating means has reached a preset maximum count, (6) means, responsive to the detection of a count which exceeds the preset maximum count by the detecting means, for changing to a second gate time within which the generating means is enabled and (7) means for displaying the count stored as the frequency measured.

BRIEF DESCRIPTION OF THE DRAWINGS

FIGS. 3 through 11 are schematic diagrams of the frequency counter of FIGS. 1 and 2;

FIG. 12 is a view showing a combination arrangement of the block diagram of FIGS. 1 and 2;

FIG. 13 is a view showing a combination arrangement of the shcematic diagrams of FIGS. 3, 4 and 5; and FIG. 14 is a view showing a combination arrangement of the schematic diagrams of FIGS. 6 through 11.

DETAILED DESCRIPTION

Figure 1:
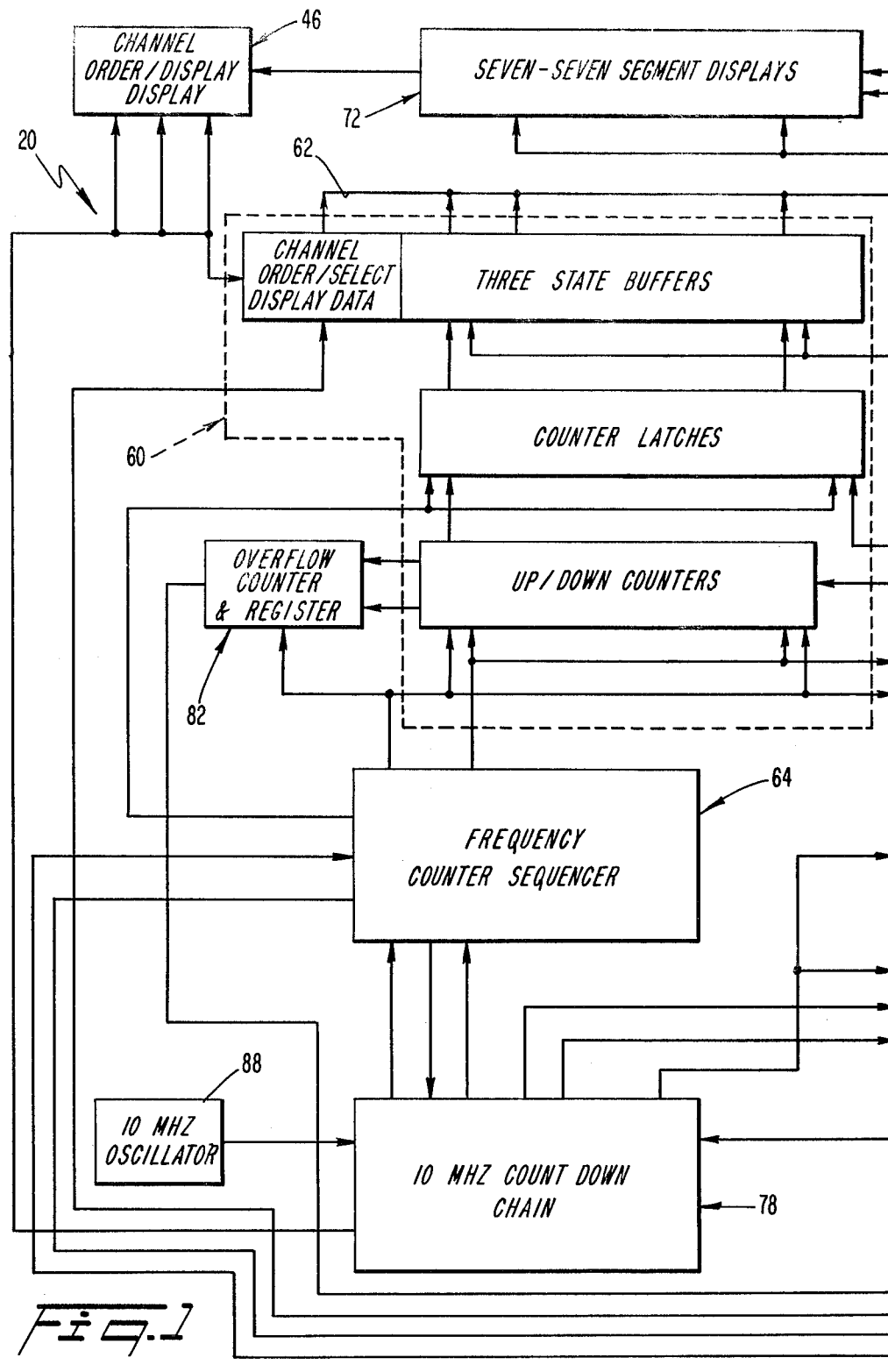
FIGS. 1 and 2 illustrate a composite block diagram of a frequency counter in accordance with certain principles of the invention.
Figure 2:
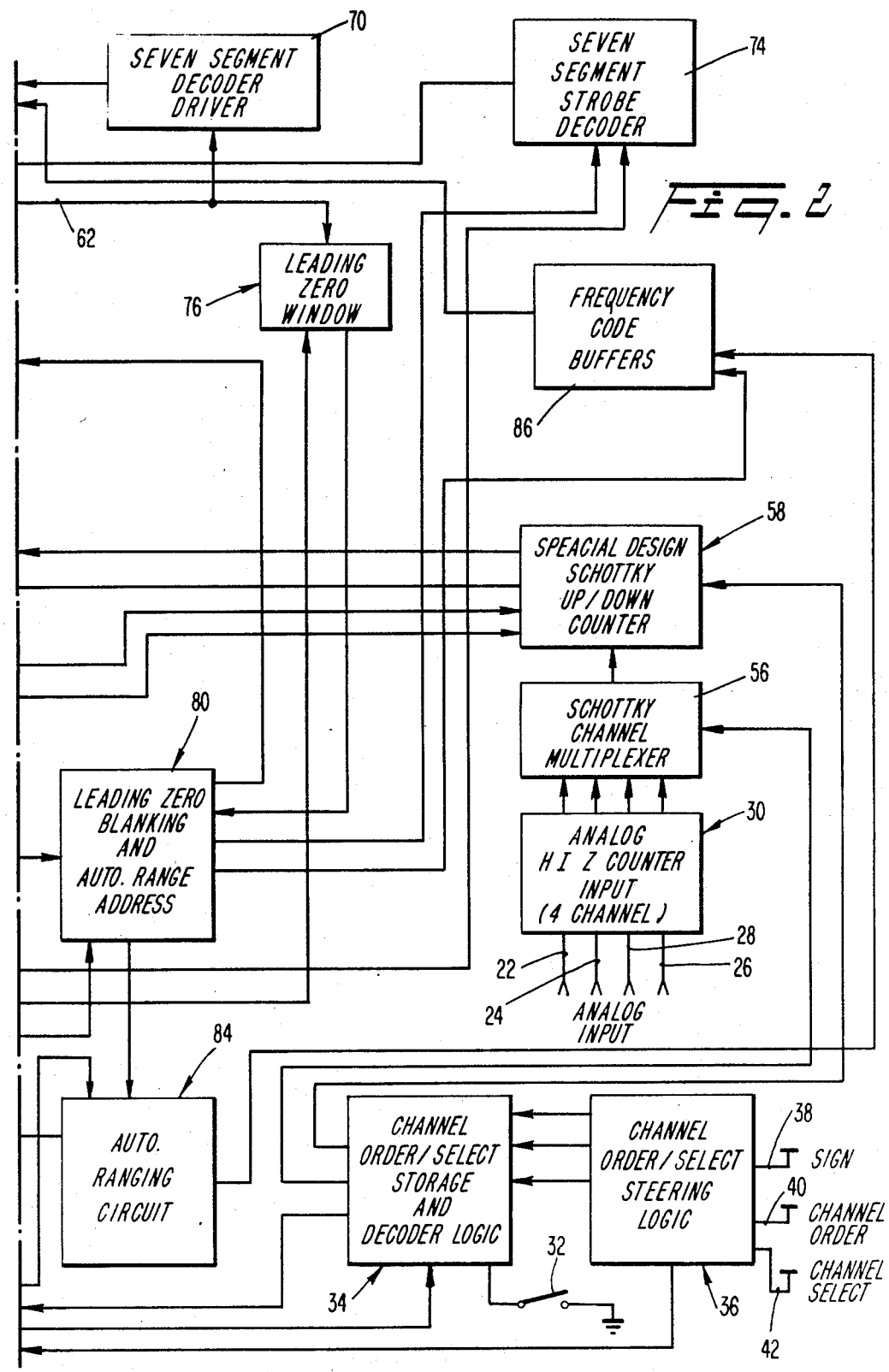

Referring to FIGS. 1 and 2, there is illustrated a frequency counter, designated generally by the numeral 20, for measuring and displaying a plurality of frequencies appearing on four high impedance input channels 22, 24, 26 and 28 (FIG. 2) of an analog input circuit, designated generally by the numeral 30 (FIG. 2). Input channels 22, 24, 26 and 28 may be displayed independently of each other or as the sum or difference of any combination of the channels in any order. The frequency counter 20 includes a program switch 32, which is coupled to a channel order/select storage and decoder logic circuit, designated generally by the numeral 34, which facilitates the operation of the counter in one of a plurality of selectable program modes. A channel order/select steering logic circuit, designated generally by the numeral 36, which is coupled to the channel order/select storage and decoder logic circuit 34, facilitates the selection and the order of the four input channels 22, 24, 26 and 28 during a measurement cycle of the counter 20. As noted above, the frequencies appearing on input channels 22, 24, 26 and 28 may be displayed independently of each other or as the sum or difference of each other in any order. Therefore, toggle switches 38, 40 and 42 are coupled to the channel order/select steering logic circuit 36 to facilitate the establishment of a sign bit, a channel order and a channel select, respectively. The sign bit must be chosen for each channel 22, 24, 26 and 28 selected during the program mode. Each sign bit is selected to facilitate a sum or a difference measurement. A channel display circuit, designated generally by the numeral 46, provides visual indication of the sign, channel select and channel order. The program switch 32 is opened to facilitate operation of the counter 20 in an operate mode.

Digital output signals generated by the analog input circuit 30 are fed to a multiplexer 56. The multiplexer 56, which receives a channel select address from the storage and decoder logic circuit 34, feeds the frequencies appearing on input channels 22, 24, 26 and 28 to a Schottky counter circuit, designated generally by the numeral 58, in the order established by the storage and decoder logic circuit 34. The storage and decoder logic circuit 34 also feeds the sign bit associated with the selected channel 22, 24, 26 and 28 to the counter circuit 58 which determines whether the counter 58 counts up or down.

The Schottky counter 58 is interfaced with a counter board, designated generally by the numeral 60, which provides a maximum count of ten megahertz (MHz) minus one when the counter 20 is operating with a one second frequency counter gate signal. Counter board 60 also provides a preset maximum, such as frequency count one hundred megahertz minus one, when the counter 20 is operating with a one-tenth of a second frequency counter gate signal. Counter board 60 feeds a binary coded decimal (BCD) data output or frequency count onto a BCD data bus 62 after the counter 20 has completed its measurement cycle. Thereafter, a reset signal, which is generated by a frequency counter sequencer, designated generally by the numeral 64, facilitates the beginning of another measurement cycle.

The BCD data, which is present on data bus 62, is fed to a seven segment decoder driver 70. The decoder driver 70 drives a seven segment display circuit, designated generally by the numeral 72. The display circuit 72 is strobed at an appropriate time by a seven segment strobe decoder 74 to facilitate the visual indication of the appropriate BCD digit.

As the BCD data is multiplexed onto the data bus 62, a leading zero window circuit, designated generally by the numeral 76, is enabled by a 10 MHz count down chain, designated generally by the numeral 78. The window circuit 76 allows leading zeros appearing on the data bus 62 to be fed to a leading zero blanking and auto range address circuit, designated generally by the numeral 80. The blanking and auto range address circuit 80 determines the location of the leading zeros and feeds a serial bit stream to the strobe decoder 74 which disables the decoder when leading zeros are present on the bus 62. For example, if the BCD data appearing on the data bus 62 is "002146," circuit 80 disables strobe decoder 74 when the leading zeros are present so that the resultant BCD data appears as "2146."

If, during the measurement cycle, the counter 20 encounters a positive input frequency, which is the first frequency to be measured during the cycle and which is greater than the possible maximum count of the counter board 60, an overflow will occur. An overflow counter circuit, designated generally by the numeral 82, will (1) detect the overflow, (2) increment itself and (3) set an overflow bit. If the next multiplexed frequency measurement in the measurement cycle is of an opposite sign and greater in magnitude than the previous overflow count, the overflow counter circuit 82 will be decremented and the overflow bit cleared. When the counter 20 has completed the measurement cycle, wherein all programmed input channels 22, 24, 26 and 28 have been measured, the overflow bit and an auto range address, which is generated by the blanking and auto range address circuit 80 are fed to an auto ranging circuit, designated generally by the numeral 84.

The auto ranging circuit 84 defines the type of measurement performed by the counter 20 such as hertz (Hz), kilohertz (KHz) or megahertz (MHz). The auto ranging circuit 84 generates and feeds (1) a frequency code, which represents the position of a decimal point, to the displays 72 through a frequency code buffer circuit 86 and (2) a gate time address to the 10 MHz count down chain 78. The gate time address facilitates the selection of a frequency gate time of one second or one-tenth of a second. The one-tenth of a second frequency gate time is selected in response to the overflow bit being set in the overflow counter circuit 82.

A 10 MHz crystal oscillator 88 provides a reference signal to the count down chain 78. The count down chain 78 provides (1) a sequencer clock signal and (2) a sequencer clock enable signal to the frequency counter sequencer 64. The frequency counter sequencer 64 and the count down chain 78 never operate simultaneously. The frequency counter sequencer clock signal is disabled during frequency gate time measurements allowing the count down chain 78 to compute the time interval of frequency counter gate. After the count down chain 78 has completed its measurements, the frequency counter sequencer 64 is enabled to (1) establish another sequencing address for the storage and decoder logic circuit 34 and (2) a new frequency gate time for the up/down counters 60 and the Schottky counter 58.

Analog Input Circuit 30

Figure 3:
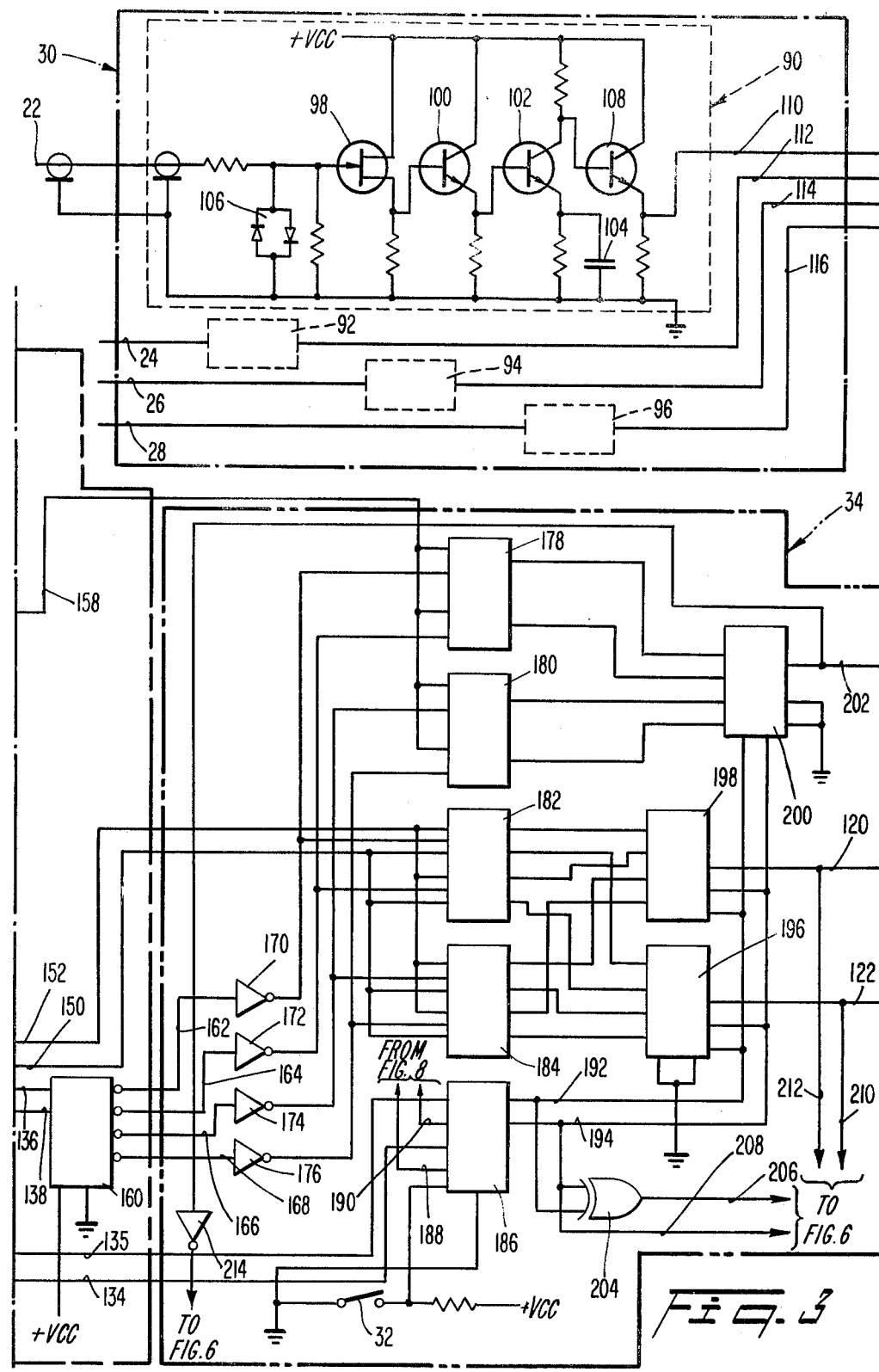

Referring to FIG. 3, the analog input circuit 30 includes four direct coupled high impedance channel circuits 90, 92, 94 and 96 which are associated with channel inputs 22, 24, 26 and 28, respectively. Channel circuits 90, 92, 94 and 96 convert analog frequency signals appearing on channel inputs 22, 24, 26 and 28, respectively, into digital frequency signals. The channel circuits 90, 92, 94 and 96 are of similar design, thus, only channel circuit 90 will be described in detail.

Channel circuit 90 includes a N-channel field-effect transistor 98 configured as a source follower to provide a high input impedance to the circuit. The source of transistor 98 delivers a signal to the base of a NPN emitter follower 100. The emitter follower 100 isolates transistor 98 from the remaining portion of channel circuit 90 while providing a low output impedance to a class A amplifier 102. Amplifier 102 utilizes an emitter bypass capacitor 104 to stabilize the gain of the amplifier as the cut-off frequency of the amplifier is approached. The gain of amplifier 102 is needed to compensate for the input frequency signal clamping action of overload protection diodes 106 and the unity gain of transistor 98 and emitter follower 100. An emitter follower 108, which is coupled to amplifier 102, provides (1) a low impedance to the multiplexer 56 (FIG. 5) and (2) isolation from the amplifier.

Frequencies, which are to be measured, appear on channel inputs 22, 24, 26 and 28 and are fed through channel circuits 90, 92, 94 and 96, respectively, to the multiplexer 56 over lines 110, 112, 114 and 116. The multiplexer 56 facilitates the multiplexing of the frequencies to the Schottky counter circuit 58 (FIG. 5) over line 118. The channel select address, which is generated by the channel order/select storage and decoder logic circuit 34, and which is present on lines 120 and 122, facilitates the addressing of each of the channels 22, 24, 26 and 28 in accordance with previously programmed channel select data.

Channel Order/Select Steering Logic Circuit 36

Figure 4:
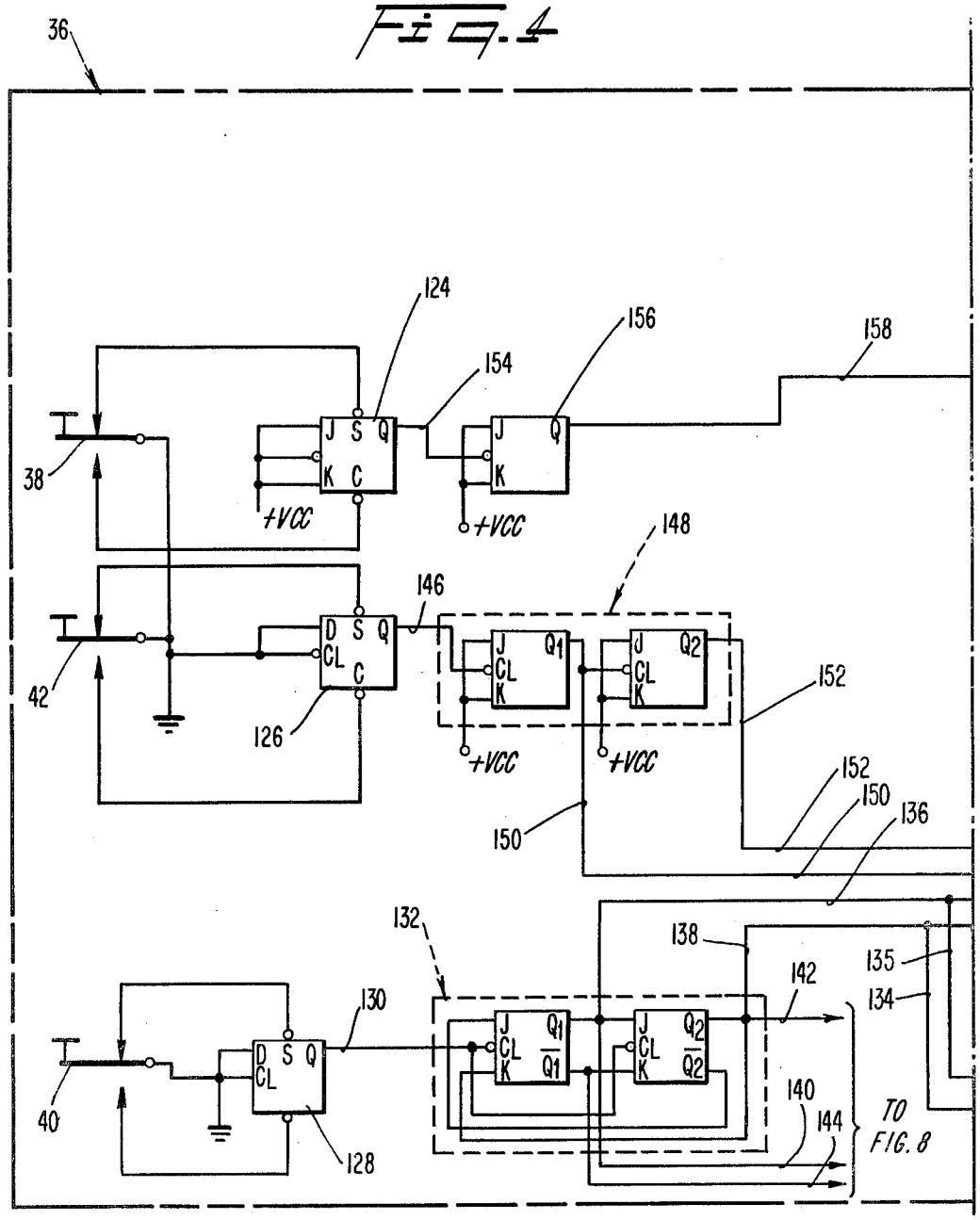

Referring to FIG. 4, toggle switches 38, 40 and 42, which are coupled to the steering logic circuit 36, facilitate the programming of the frequency counter 20 (FIGS. 1 and 2). Toggle switches 38, 40 and 42 facilitates the programming of the sign, channel order and channel select, respectively. The toggle switches 38, 40 and 42 are coupled to latches 124, 126 and 128, respectively, which facilitate the debouncing of the appropriate switch.

Signals appearing on output 130 of latch 128 are used to increment a channel order counter, designated generally by the numeral 132. The channel order counter 132 indicates the order in which the input channels 22, 24, 26 and 28 are to be measured. Moreover, the channel order counter 132 facilitates the generation by address states A and B. The address states A and B are fed (1) to the storage and decoder logic circuit 34 (FIG. 3) over lines 134, 135, 136 and 138 and (2) in addition to the complement of address state A to the frequency counter sequencer 64 (FIGS. 1 and 8) over lines 140, 142 and 144, respectively. Each time the channel order counter 132 is incremented, one of the input channels 22, 24, 26 and 28 and a sign, which is to be associated therewith, must be selected. Thus, signals appearing on output 146 of latch 126 are used to increment a channel select counter, designated generally by the numeral 148. The contents of the channel select counter 148 indicates the next channel input 22, 24, 26 or 28 which is to be measured. The contents of the channel select counter 148 is also fed to the storage and decoder logic circuit 34 (FIG. 3) over lines 150 and 152. Signals appearing on output 154 of latch 124, which is associated with the sign bit, is fed to a toggle flip-flop 156. The sign bit which appears on output 158 of flip-flop 156 is also fed to storage and decoder logic circuit 34 (FIG. 3).

Channel Order/Select Storage and Decoder Logic Circuit 34

Referring again to FIG. 3, the storage and decoder logic circuit 34 performs the function of a small memory which stores channel select and sign data and is addressed by the register address generated by the steering logic circuit 36 (FIG. 4). The register address is fed from the steering logic circuit 36 over lines 136 and 138 to a decoder 160. Decoder 160 converts the register address into a one-of-four code and feeds output signals appearing on the outputs 162, 164, 166 and 168 through inverters 170, 172, 174 and 176, respectively, to latch circuits 178, 180, 182 and 184, respectively. The sign data, which is fed from the steering logic circuit 36 (FIG. 4) over line 158, is stored in latch circuits 178 and 180 when the appropriate latch circuit is enabled by decoder 160. The channel select data, which is also fed from the steering logic circuit 36 over lines 150 and 152, is stored in latch circuits 182 and 184 when the appropriate latch circuit is enabled by decoder 160.

The register address is also fed to a multiplexer 186 over lines 134 and 135. A sequencing address, which is generated by the frequency counter sequencer 64 (FIGS. 1 and 8) and is represented by address states E and F, is also fed to the multiplexer 186 over lines 188 and 190, respectively. The program switch 32 facilitates the selection of the register address or the sequencing address by the multiplexer 186. When the program switch 32 is in a closed position, the storage and decoder logic circuit 34 operates in a program mode and the register address is multiplexed onto outputs 192 and 194. When the program switch 32 is in an open position, the storage and decoder logic circuit 34 operates in an operate mode and the sequencing address is multiplexed onto outputs 192 and 194. Signals appearing on outputs 192 and 194 are fed to multiplexers 196, 198 and 200. Multiplexers 196 and 198 facilitate the retrieval of the appropriate channel select data stored in latch circuits 182 and 184 and feeds the data to the multiplexer 56 (FIG. 5) as the channel select address, over lines 120 and 122. The channel select address enables the multiplexer 56 (FIG. 5) to sequentially address and select each channel input 22, 24, 26 and 28 which was previously programmed. Multiplexer 200 facilitates the retrieval of the appropriate sign data which is stored in latch circuits 178 and 180 and feeds the data to the Shottky counter circuit 58 (FIG. 5) over line 202.

Signals appearing on outputs 192 and 194 are also fed to an exclusive OR gate 204 which logically encodes the signals into channel order display data. The channel order display data is then fed to the counter board 60 (FIGS. 1, 6 and 7) over lines 206 and 208. The channel select data, which is retrieved by multiplexers 196 and 198 and which appears on lines 120 and 122, is also fed to the counter board 60 (FIGS. 1, 6 and 7) over lines 210 and 212 as the channel select display data. The sign data which appears on line 202 is fed through inverter 214 to the channel order/select display unit 46 (FIGS. 1 and 6) over line 216.

Shottky Counter Circuit 58

Figure 5:
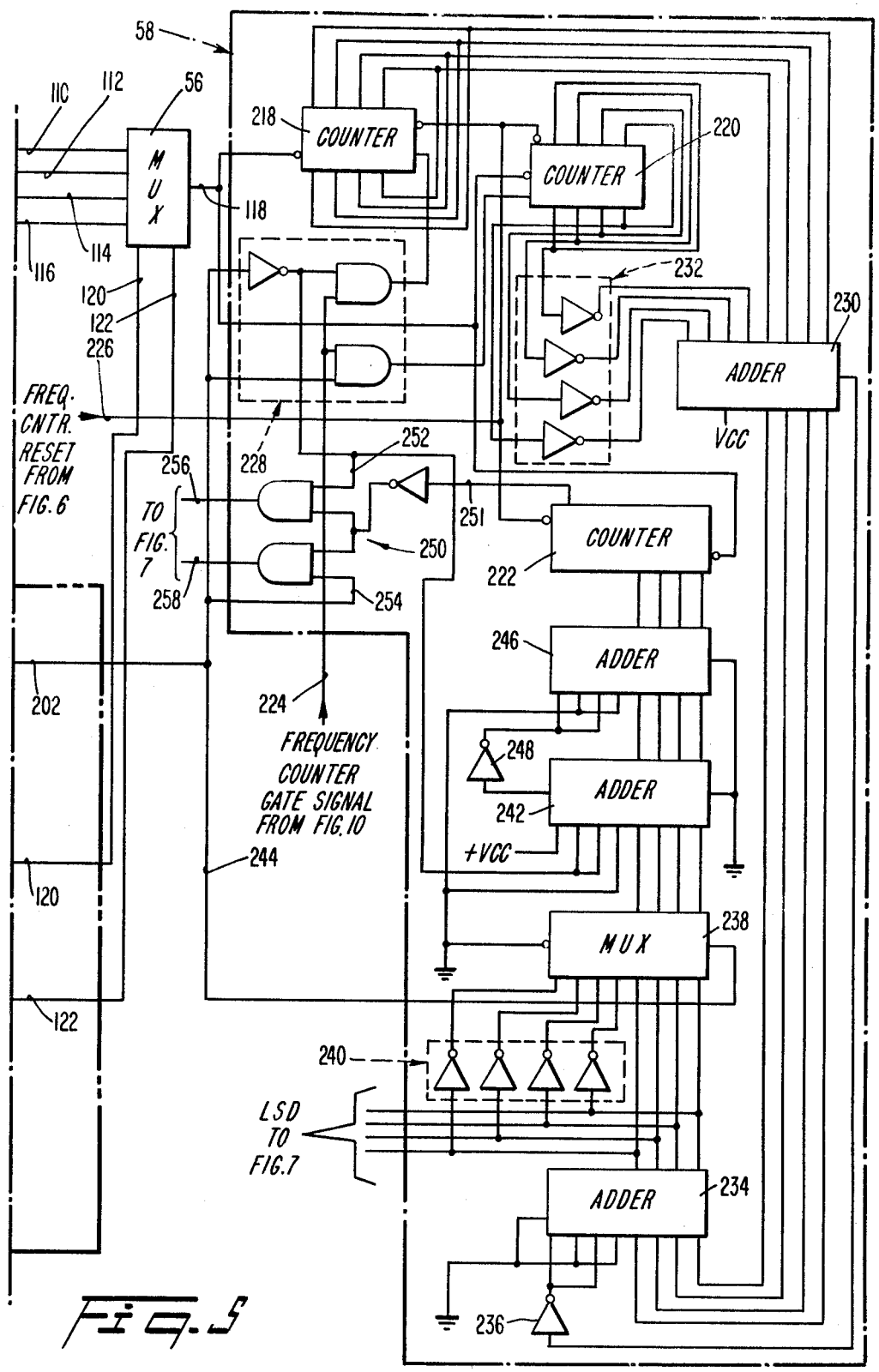

Referring to FIG. 5, as noted above, frequency signals appearing on channel inputs 22, 24, 26 and 28 (FIG. 3) are multiplexed to the Skottky counter circuit 58 over line 118 by multiplexer 56. Frequency signals appearing on line 118 facilitate the clocking of counters 218, 220 and 222. Counters 218, 220 and 222 are high-speed BCD programmable ripple counters. The counter circuit 58 also receives (1) a frequency counter gate signal from the frequency counter sequencer 64 (FIGS. 1 and 8) on line 224, (2) the sign data from the storage and decoder logic circuit 34 on line 202 and (3) a counter reset signal, which is generated by the frequency counter sequencer 64, on line 226. The presence of the frequency gate signal on line 224 defines the frequency counter 20 measurement cycle. The frequency counter gate signal and the sign data are fed to a decoder circuit, designated generally by the numeral 228. The decoder circuit 228 (1) facilitates the operation of counters 218 and 220 in a load mode when the frequency counter gate signal is a logic "zero," (2) enables counter 218 to count while holding counter 220 in the load mode, when the frequency counter gate signal is a logic "one" and the sign data is a logic "zero" and (3) enables counter 220 while holding counter 218 in the load mode when the frequency counter data signal and the sign data are both a logical "one."

A BCD digit, which is generated by counter 218 and which represents an up count, is fed to a full adder circuit 230. Output signals, which represent another BCD digit and which are generated by counter 220, are fed through an inverter circuit, designated generally by the numeral 232, to the adder circuit 230. The BCD digit generated by counter 220 also represents a down count. The adder circuit 230 has its carry-in input coupled to a logic "one" which faciliates "two's complement" addition. Output signals of the adder circuit 230, which represent a sum of the two BCD digits, may represent a positive or a negative quantity. Negative and positive quantities are identified by the logic state of a carry-out bit of adder circuit 230. A carry-out bit of logic one represents a positive sum and a carry-out bit of logic "zero" represents a negative sum. Output signals from adder circuit 230 are fed to adder circuit 234. Adder circuit 234 facilitates the generation of an absolute value of the sum produced by adder circuit 230 by adding a binary value of zero to positive quantities and a binary value of ten to negative quantities. Inverter 236 facilitates the selection of the binary values zero and ten as a result of the carry-out signal generated by adder circuit 230.

Output signals, which are generated by adder circuit 234, and which are in a BCD format, represents the difference between the BCD digits generated by counters 218 and 220. Moreover, the BCD output represents the least significant BCD digit generated during the last-frequency counter gate signal or measurement cycle. The BCD output of adder circuit 234 is fed (1) to the counter board 60 (FIGS. 1, 6 and 7), (2) to a multiplexer 238 and (3) also to the multiplexer through an inverter circuit, designated generally by the numeral 240, which generates a complement of the BCD output. Multiplexer 238, under control of the sign data, which is provided by the storage and decoder logic circuit 34 (FIGS. 2 and 3) facilitates the feeding of the BCD output of adder circuit 234 in the complemented or noncomplemented form to full adder circuit 242. If the sign data, which appears on line 244 is a logic "zero," the noncomplemented form of the BCD output of adder 234 is fed to adder circuit 242. Adder circuit 242 facilitates the addition of a binary value of fourteen to the BCD output if the sign data is a logic "zero." Adder circuit 246 facilitates the addition of a binary value of zero or ten to a sum quantity which is generated by adder circuit 242. If the carry-out bit of adder circuit 242, which is fed through inverter 248, is a logic "zero," a binary value of ten is added to the sum quantity. However, if the carry-out bit of adder circuit 242 is a logic "one," a binary value of zero is added to the sum quantity. Thereafter, adder circuit 246 feeds its output signals to counter 222.

Figure 6:
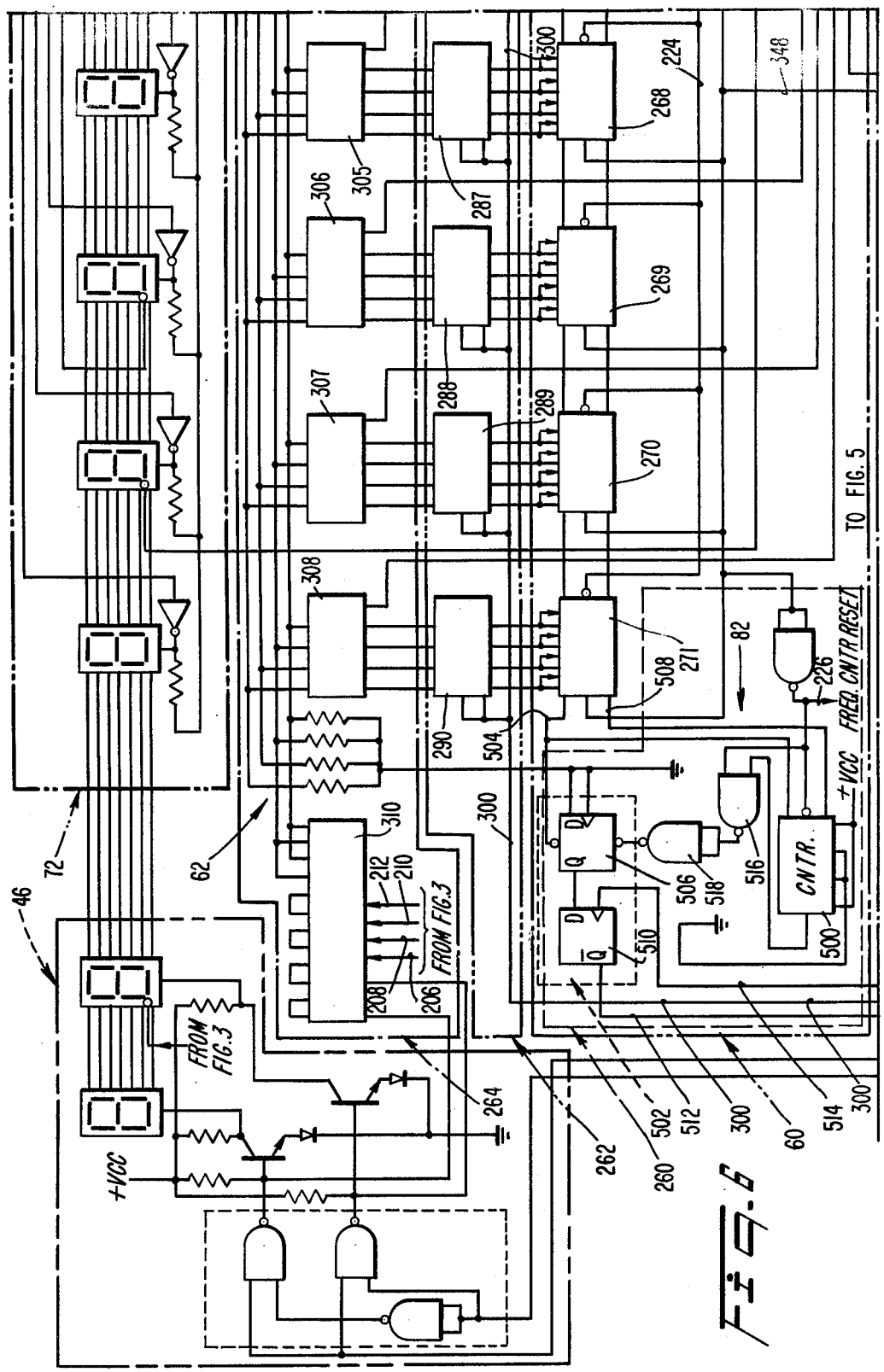

Counter 222 facilitates the generation of a clock pulse which is encoded to represent either an up-count clock pulse or a down-count clock pulse. Counter 222 feeds the generated clock pulse to a decoder circuit, designated generally by the numeral 250, over line 251. The decoder circuit 250 also receives the sign data from the storage and decoder logic circuit 34 (FIGS. 2 and 3) over lines 252 and 254. The logical state of the sign data determines whether the up-count or the down-count clock pulse is generated by decoder circuit 250. The up-count clock pulse and the down-count clock pulse, which appear on lines 256 and 258, respectively, are fed to counters 60 (FIGS. 1 and 6). The Shottky counter circuit 58 synchronizes the feeding of (1) the up-count and down-count clock pulses generated by counter 222 and (2) the output signals of adder 234 to counter board 60 (FIGS. 1, 6 and 7).

Counter Board 60

Figure 7:
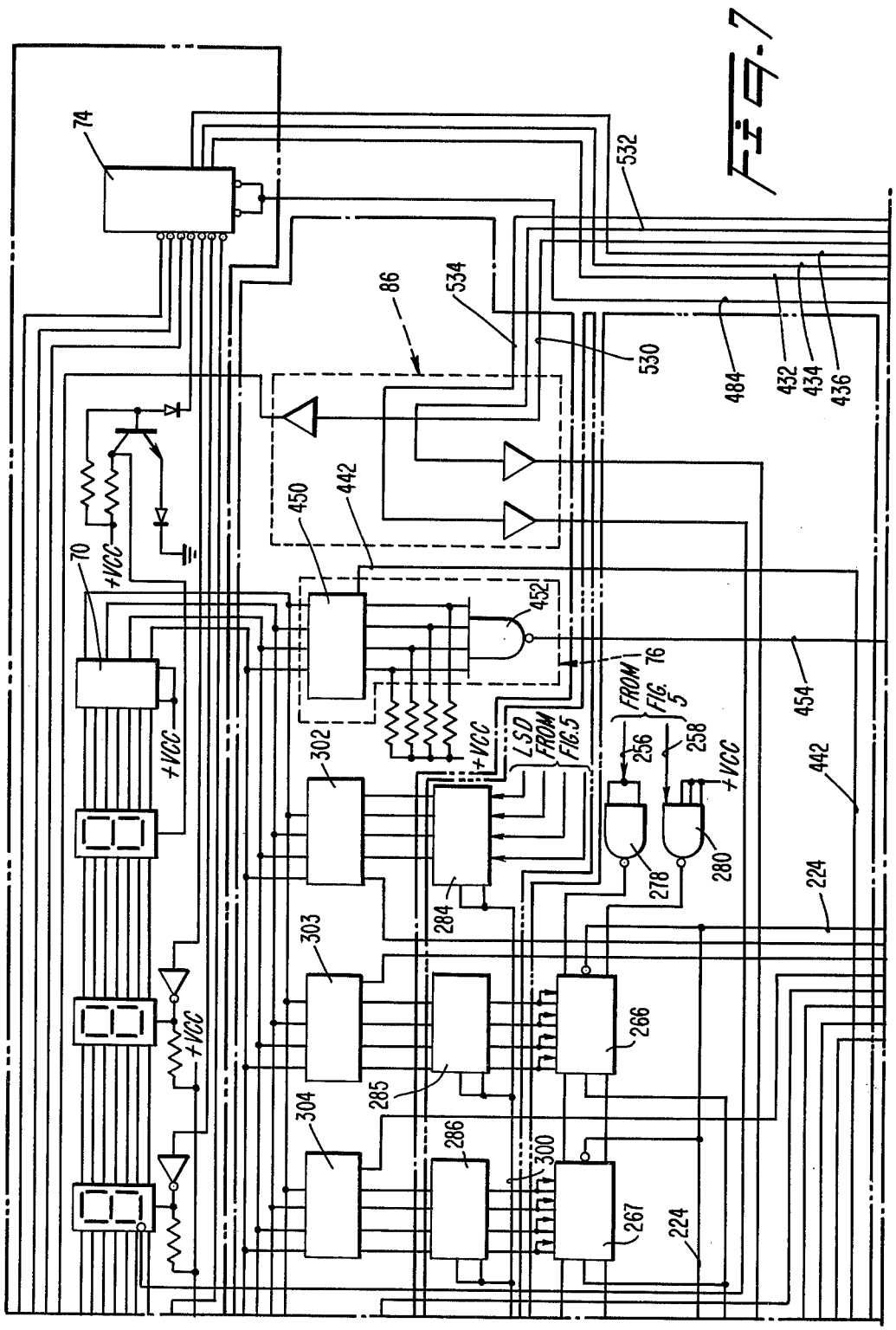

Referring to FIGS. 6 and 7, the counter board 60 includes an up/down counter circuit, designated generally by the numeral 260, a counter latch circuit, designated generally by the numeral 262, and a buffer circuit, designated generally by the numeral 264. The counter board 60 facilitates the counting of frequencies appearing channel inputs 22, 24, 26 and 28 (FIGS. 2 and 3) under the control of the Schottky counter circuit 58 (FIGS. 2 and 5).

Up/Down Counter Circuit 260

The counter circuit 260 includes six synchronous four-bit up/down counters 266 through 271. The up-count and down-count clock pulses, which are fed from the Schottky counter circuit 58 (FIGS. 2 and 5) over lines 256 and 258, are fed through NAND gates 278 and 280, respectively, to counter 266. Counters 266 through 271 are capable of performing frequency addition and frequency subtraction. Frequency addition is accomplished within the counter board 60 by pulsing the up-count clock pulse, which appears on line 256, while holding the down-count clock pulse, which appears on line 258, in a logic "one" state. Frequency subtraction is accomplished by pulsing the down-count clock pulse while holding the up-count clock pulse in the logic "one" state. Counters 266 through 271 are enabled to count only during the presence of the frequency counter gate signal, which is generated by the frequency counter sequencer 64 (FIGS. 1 and 8) and which appear on line 224. Count output signals, which are generated during the measurement cycle by counters 266 through 271, are fed to the counter latch circuit 262.

Counter Latch Circuit 262

The counter latch circuit 262 includes seven four-bit bistable latch circuits 284 through 290. Latch circuits 285 through 290 facilitate the storage of count output signals fed from counters 266 through 271, respectively. Latch circuit 284 stores BCD output signals which are generated by adder circuit 234 (FIG. 5). The frequency counter sequencer 64 generates and feeds a latch enable signal to the counter latch circuit 262 over line 300. Each of the latch circuits 284 through 290 are enabled and then disabled prior to counters 266 through 271 being reset by the frequency counter sequencer 64.

Buffer Circuit 264

The buffer circuit 264 includes seven four-bit three-state devices 302 through 308. The three-state devices 302 through 308 are coupled to latch circuits 284 through 290, respectively, and facilitate the multiplexing of the count output signals onto the data bus 62. The leading zero blanking and auto range circuit 80 enables the three-state devices 302 through 308 in a sequential order. Device 302, which is associated with latch circuit 284, facilitates the multiplexing of the count output signals associated with the least significant BCD digit of the frequency measured by the counter 20. Device 308 is associated with the most significant BCD digit measured frequency.

As noted above, output signals associated with devices 302 through 308 are multiplexed onto the data bus 62. After the most significant BCD digit has been multiplexed onto the data bus 62, channel order and channel select data are multiplexed onto the data bus through device 310 under the control of the 10 MHz count down chain 78 (FIG. 1). Output signals appearing on the data bus 62 are fed to a seven segment decoder driver 70 (FIGS. 2 and 7).

Frequency Counter Sequencer 64

Figure 8:
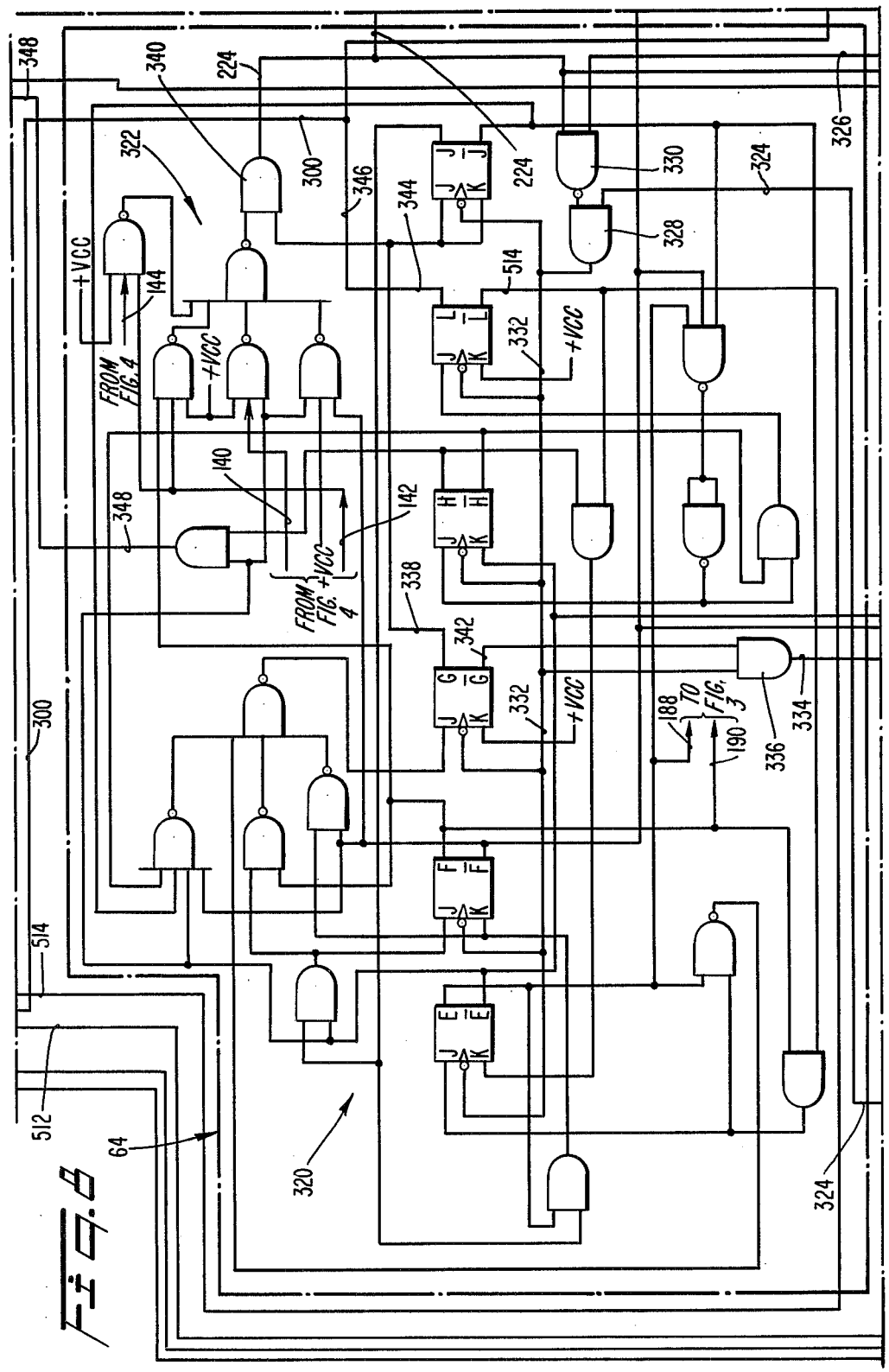
Figure 9:
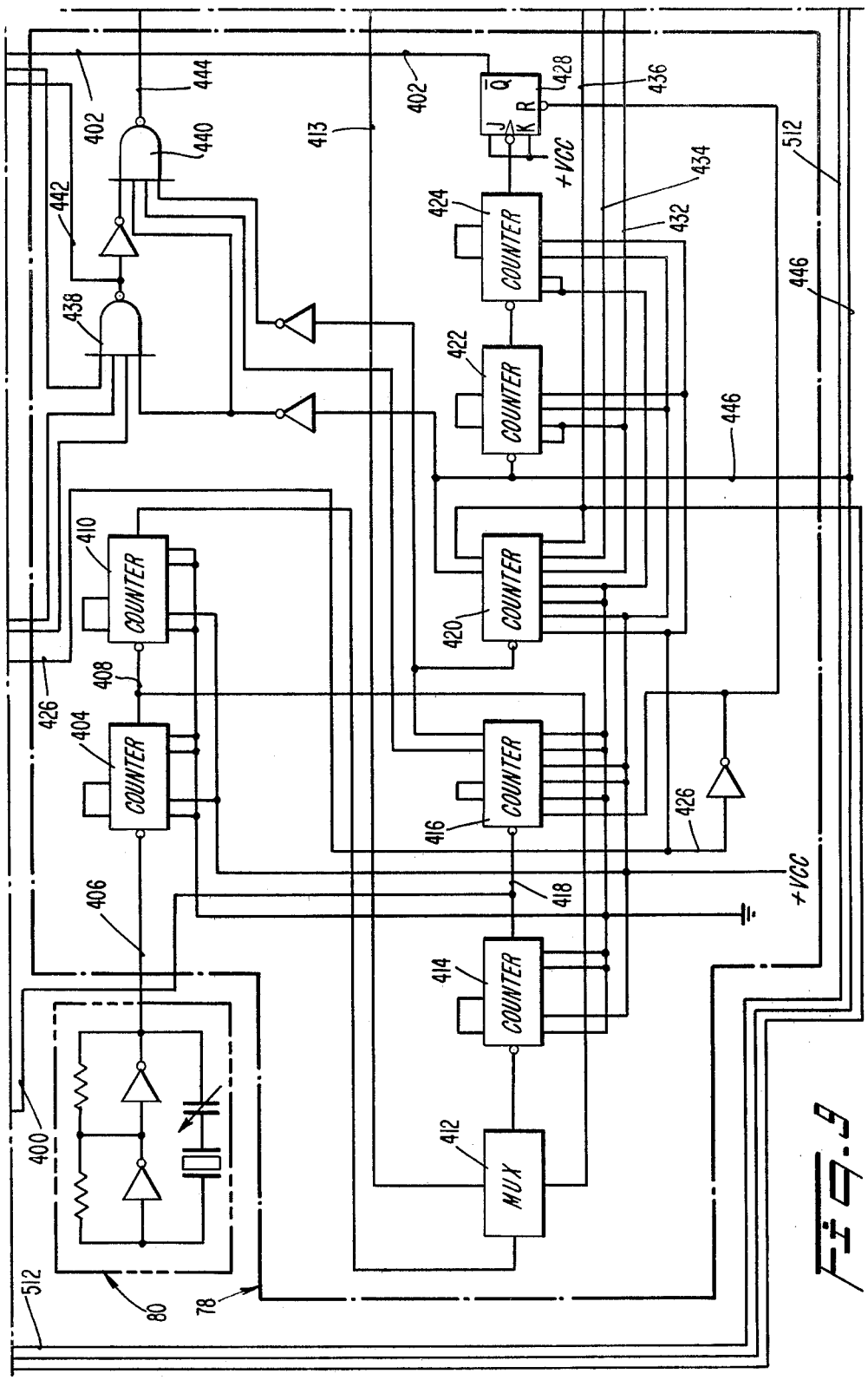

Referring to FIG. 8, the frequency counter sequencer 64 facilitates the generation of the frequency counter gate signal which establishes the duration of the frequency counter measurement cycle. The frequency counter sequencer 64 includes a state address circuit, designated generally by the numeral 320, and a comparator circuit, designated generally by the numeral 322. The sequencer 64 receives (1) a sequencer clock signal, which is fed over line 324, and (2) a sequencer clock enable signal, which is fed over lines 326, from the 10 MHz count down chain 78 (FIGS. 1 and 9). The sequencer clock signal and the sequencer clock enable signal are fed to AND gate 328 and NAND gate 330, respectively, of the state address circuit 320. The frequency counter gate signal, which appears on line 224, is fed to NAND gate 330. If the logical state of either the frequency counter gate signal or the sequencer clock enable signal is a logic "zero," the sequencer clock signal appears on line 332 and enables the state address circuit 320 to progress to the next state of the measurement cycle. However, if the frequency counter gate signal and the sequencer clock enable signal are both in a logical "one" state, the sequencer clock signal is inhibited which precludes the state address circuit 320 from progressing to the next state in the measurement cycle.

The frequency counter sequencer 64 also generates and feeds a count down clock enable signal to the 10 MHz count down chain 78 (FIGS. 1 and 9) over line 334. As noted above, when the frequency counter gate signal and the sequencer clock enable signal are both in the logic "one" state, the sequencer clock signal is inhibited thus feeding a logic "zero" state to line 332. The sequencer clock signal appearing on line 332 is also fed to AND gate 336. AND gate 336 thereafter feeds a logic "zero" signal over line 334 to enable the count down chain 78. After the count down chain has achieved a full count in either the one second gate time or one-tenth of a second gate time, the sequencer clock enable signal becomes a logic "zero" and enables the frequency counter sequencer 64 to progress to the next state.

The logical state of the signal appearing on line 338 of the state address circuit 320 becomes a logic "zero" upon the negative transistion of the next sequencer clock signal. The signal appearing on line 338 is fed to AND gate 340. Thereafter the frequency counter gate signal, which appears on line 224, is inhibited and becomes a logic "zero." Occurring simultaneously with the signal transistion on line 338, the signal appearing on line 342 becomes a logic "one." Logic signals appearing on line 342 are fed to AND gate 336. Upon the occurrence of the positive transition of the next sequencer clock signal, the state of the signal appearing on line 332 becomes a logic "one" which facilitates the generation of the count down reset signal. The count down reset signal appearing on line 334 resets and enables the count down chain 78 to facilitate the beginning of another measurement cycle.

As noted above, the frequency counter sequencer 64 and the count down chain 78 do not operate simultaneously. The count down chain 78 provides the frequency counter sequencer 64 with the sequencer clock enable signal while the frequency gate signal disables the sequencer clock signal and facilitates the generation of the count down enable signal. When the frequency counter 64 sequencer has completed the generation of all of the state addresses, a signal having a state of logic "one" appears on output line 344 of the state address circuit 320. The signal appearing on line 344 is the latch enable signal and is fed to (1) the counter board 60 (FIGS. 1, 6 and 7) over line 300 and (2) the auto ranging circuit 84 (FIGS. 2 and 11) over line 346. The positive transistion of the latch enable signal is fed to the overflow counter circuit 82 (FIGS. 1 and 6) over line 514. Thereafter, the sequencer 64 generates and feeds a counter reset signal to (1) the counter board 60 and (2) the overflow counter circuit 82 over line 348.

10 MHz Count Down Chain 78

Referring to FIG. 9, the count down chain 78 facilitates the generation of (1) the sequencer clock signal and (2) the sequencer clock enable signal and feeds these signals to the frequency counter sequencer 64 (FIGS. 1 and 8) over lines 400 and 402, respectively. The 10 MHz reference signal which is generated by the oscillator 80, is fed to counter 404 of the count down chain 78 over line 406. Counter 404, which is configured to operate continously as a bi-quinary counter, divides the 10 MHz reference signal by ten and feeds a 1 MHz output signal over line 408 to counter 410 which is also configured as a bi-quinary counter. Counters 404 and 410 feed the 1 MHz output signal and a 100 KHz output signal, respectively, to a multiplexer 412. Multiplexer 412 also receives a gate time address input from the auto ranging circuit 84 over line 413. The gate time address bit enables the multiplexer to select one of the two frequency input signals. A selection of the 100 KHz signal corresponds to the one second gate time and a selection of the 1 MHz signal corresponds to the one-tenth of a second gate time. The selected frequency signal facilitates the clocking of counter 414 which is also configured to operate continuously as a bi-quinary counter. Counter 414 feeds its output signal to a programmable decade counter 416 over line 418. The frequency signal appearing on line 418 is also fed to the frequency counter sequencer 64 over line 400 as the sequencer clock.

Counter 416 is cascaded with counters 420, 422 and 424. Counter 420 is configured as a decade counter and counters 422 and 424 are configured as bi-quinary counters. Counters 416, 420, 422 and 424 facilitate the derivation of the frequency gate time. A ripple count of $1_{10}$ to $10,000_{10}$ is made during the frequency counter measurement cycle. A count down reset signal, which is fed from the sequencer 64 (FIGS. 1 and 8) over line 426, (1) facilitates the loading of an initial count into the counter 416, (2) reset counters 420, 422 and 424 and (3) enables the counters during the frequency counter measurement cycle.

A flip-flop 428, which is coupled to counter 424 facilitates the generation of the sequencer clock enable signal. The sequencer clock enable signal is fed to the sequencer 64 over line 402. Once the count down chain has attained the maximum count, flip-flop 428 is toggled and the signal appearing on line 402 becomes a logical "zero."

Counter 420 also generates the strobe address. The strobe address is fed to (1) the leading zero blanking and auto range address circuit 80 (FIGS. 2 and 10) and (2) the seven segment strobe decoder 74 (FIGS. 2 and 7) over lines 432, 434 and 436. The most significant bit of counter 420 is fed to NAND gates 438 and 440 over line 441 to facilitate the generation of (1) a window enable signal, which is fed to the leading zero window circuit 76 (FIGS. 2 and 7) over line 442 and (2) a synchronous bus clock signal, which is fed to the leading zero blanking circuit 80 (FIGS. 2 and 10) over line 444. The most significant bit is also fed over line 446 to the leading zero blanking and auto range address circuit 80 as a disabling signal.

Leading Zero Window Circuit 76

Referring again to FIG. 7, the leading zero window circuit 76 is enabled by the window enable signal which is generated by the count down chain 78 (FIGS. 1 and 9) and which appears on line 442. The window circuit 76 detects zeros which appear on data bus 62 during the first channel order of the measurement cycle. The window circuit 76 includes a three-state buffer circuit 450 and a NAND gate 452. The buffer circuit 450, which is coupled to the data bus 62, feeds the logical states of the data appearing on the bus to NAND gate 452. NAND gate 452 generates and feeds a serial strobe information signal over line 454 to the leading zero blanking and auto range address circuit 80 (FIGS. 2 and 10) which determines the position of leading zeros present on the data bus 62.

Leading Zero Blanking and Auto Range Address Circuit 80

Referring to FIG. 10, the leading zero blanking and auto range address circuit 80 facilitates (1) the suppression of the leading zero detected in the measured frequency counter data from the most recent measurement cycle and (2) generates and feeds an auto range address to the auto ranging circuit 84 (FIGS. 2 and 11). The leading zero blanking and auto range circuit 80 is enabled to operate only during the first channel order of the measurement cycle and prior to any channel order and channel select data appearing on the bus 62. The strobe address, which is generated by the count down chain 78 (FIGS. 1 and 9), is fed to (1) a discrete decoder circuit, designated generally by the numeral 456, and (2) to a demultiplexer 458. Demultiplexer 458 facilitates the feeding of the latched BCD frequency data of the most previous measurement cycle, which is stored in the counter latch circuit 262 (FIGS. 6 and 7) through the buffer circuit 264 (FIGS. 6 and 7) onto the data bus 62 (FIGS. 1, 6 and 7).

A serial to parallel shift register 460 facilitates the storage of the leading zero information data received from the leading zero window circuit 76 (FIGS. 2 and 7). Serial inputs 462 and 464 are coupled to a logic "one" input which enables shift register 460 to always shift in logic "ones." The strobe address and the synchronous bus clock signal, which are generated by the countdown chain 78 (FIGS. 1 and 9), are decoded by the decoder circuit 456 to produce an output signal which will clock or clear the shift register 460. The output signal generated by decoder 456, which appears on line 466, is fed to AND gate 468 to facilitate the generation of a shift register clock signal and (2) to NAND gate 470 to facilitate the generation of a shift register clear signal. The logical state of the serial strobe information signal, which is fed from the leading zero circuit 76, determines whether the shift register 458 is clocked or cleared.

If all of the data bits on the data bus 62 (FIGS. 1, 6 and 7) are in a logic "zero" state, the serial strobe information signal, which appears on line 454, will be a logic "zero." The serial strobe information signal is fed (1) to NAND gate 470 and (2) through NOR gate 472 to AND gate 468. The logic "zero" state of the serial strobe information signal facilitates the generation of the shift register clock signal and disables the shift register clear signal. However, if all of the data bits on the data bus 62 are not in the logic "zero" state, the state of the serial strobe information signal will be a logic "one" which facilitates the generation of the shift register clear signal and disables the shift register clock signal. As noted above, the leading zero window circuit 76 (FIGS. 2 and 7) is enabled during the first channel order of the measurement cycle and prior to any channel order and channel select display data is fed onto the bus 62. Thus, when the first frequency measurement which is associated with the first channel order is completed, shift register 460 will contain data which indicates the number of leading "zeros" present on the bus 62.

Shift register 460 feeds its parallel output signals to inputs of comparators 472 and 474 and latch circuits 476 and 478. The comparators 472 and 474 facilitate the comparison of the data stored in the latch circuits 476 and 478 with the output signals generated by shift register 460. The data stored in comparators 476 and 478 represent the number and position of leading "zeros" of a previous measurement cycle. The data stored in shift register 460 represents the number and position of leading "zeros" of the most recent measurement cycle. If the previous data differs from the most recent data, NOR gate 480 facilitates the enablement of latch circuits 476 and 478 so that the data stored therein may be updated with the most recent data.

Latch circuits 476 and 478 feed their complemented output signals to a multiplexer 482. Multiplexer 482 feeds the data received from latch circuits 476 and 478 in serial form over line 484 to the seven segment strobe decoder 74 (FIGS. 2 and 7) in sequence with the strobe address which is generated by the count down chain 78 (FIGS. 1 and 9). The strobe decoder 74 facilitates the suppression of leading zeros as they appear on the display circuit 72 (FIGS. 1, 6 and 7).

Shift register 460 also feeds output signals appearing on output lines 486 and 488 to the auto ranging circuit 84 (FIGS. 2 and 11) as the auto range address. The auto range address facilitates the selection of one of the frequency gate times generated by the count down chain 78 (FIGS. 1 and 9).

Overflow Counter Circuit 82

Referring to FIG. 6, the overflow counter circuit 82 includes an up/down counter 500 and an overflow register, designated generally by the numeral 502. As noted above, the counter board 60 has the capability of frequency addition and frequency subtraction. If during frequency addition the maximum count of the counter board 60 is exceeded, a counter overflow condition will occur. When the overflow condition occurs, a transistion signal which changes from a high state to a low state appears on line 504 of counter 271. This transistion signal facilitates (1) presetting a flip-flop 506 to a logic "one" and (2) incrementing the counter 500. Counter 500 facilitates the storage of the total number of different overflow conditions which occur during one measurement cycle. During frequency subtraction, a transistion signal which changes from a high state to a low state and which appears on line 508 decrements counter 500. Thus, if an equal number of increments and decrements of counter 500 occur during the measurement cycle, flip-flop 506 and counter 500 are reset.

When the frequency measurement cycle has been completed, the logical state of flip-flop 506 is fed to flip-flop 510. If the logical state of the overflow bit which is the signal appearing on output line 512 of flip-flop 510 is a logic "zero," a greater number of increments or overflow conditions have occurred. The overflow bit is fed to the auto ranging circuit 84 (FIGS. 2 and 11) on the positive transistion of the latch enabled signal appearing on line 514. The overflow bit facilitates the selection of one-tenth of a second gate time. After the negative transistion of the latch enable signal has occurred, the frequency counter reset signal facilitates loading counter 500 with an initial BCD count of nine. The initial BCD count of counter 500 facilitates the generation of a signal which is fed through NAND gates 516 and 518 to clear flip-flop 506.

Auto Ranging Circuit 84

Referring to FIG. 11, the auto ranging circuit 84 facilitates the generation of (1) the gate time address and (2) the frequency code which represents the position of the decimal point. The auto range address, which is generated by the leading zero blanking and auto range address circuit 80 (FIGS. 2 and 11) and which is fed over lines 520 and 522, is fed (1) to AND gate 524 and (2) through inverter 526 to AND gate 528. The overflow bit, which is generated by the overflow counter 82 (FIGS. 1 and 6), is fed to AND gates 524 and 528 over line 512. The overflow bit is logically combined with the auto range address to generate signals which represent the frequency code. Signals appearing on lines 530, 532 534 are associated with a format of 0.1 second MHz, 1 second MHz and 1 second KHz, respectively. The signal appearing on line 530 is also fed to the count down chain 78 (FIGS. 1 and 9) over line 413 as the gate time address. If the gate time address is in a logic "zero" state, the count down chain 78 selects the one-tenth of a second gate time. The auto ranging circuit 84 otherwise facilitates the selection of the one second gate time. The frequency code signals appearing on lines 530, 532 and 534 are fed to the frequency code buffers 86 (FIGS. 2 and 7) to facilitate the correct position of the decimal point on the display circuit 72 (FIGS. 1, 6 and 7).

What is claimed is:

1. A frequency counter, which comprises:
    means for feeding a plurality of frequency signals, which are to be measured, to the frequency counter;
    means for programming the frequency counter to operate in any one of a plurality of selectable modes;
    means, enabled during a first gate time, for generating a count which is representative of the frequency of the signals measured;
    means for storing the count generated by the generating means;
    means for detecting whether the count generated by the generating means has reached a preset maximum count;
    means, responsive to the detection of a count which exceeds the preset maximum count by the detection means, for changing to a second gate time within which the generating means is enabled; and
    means, for displaying the count stored in the storing means as a representation of the frequency measured.

2. The frequency counter as set forth in claim 1 which further comprises:
    means for blanking leading zeros which are a part of the count in the displaying means;
    means for establishing a reference frequency; and
    means for positioning a decimal point within the representation of the frequency measured which is displayed by the displaying means.

3. The frequency counter as set forth in claim 1 wherein each of the frequency signals are analog signals and wherein the feeding means comprises:
    a plurality of input channels; and
    means for converting each of the plurality of analog frequency signals, which are fed through the plurality of input channels, into digital frequency signals.

4. The frequency counter as set forth in claim 1 wherein the programming means comprises:
    means for assigning a sign bit to be associated with each of the plurality of frequency signals;
    means for establishing an order within which the plurality of frequency signals are to be measured; and
    means for combining the frequency signals in the order generated by the establishing means and in response to the sign bit associated with each of the frequency signals.

5. The frequency counter as set forth in claim 4 wherein the combining means comprises:
    means, responsive to the assignment of the sign bit by the assigning means, for adding the plurality of frequency signals in the order generated by the establishing means; and
    means, responsive to the assignment of the sign bit by the assigning means, for subtracting the plurality of frequency signals in the order generated by the establishing means.

6. The frequency counter as set forth in claim 4 wherein the generating means comprises:
    a plurality of binary coded decimal counters which are capable of counting in an up direction and a down direction; and
    means, responsive to the assignment of the sign bit, for determining which direction the generating means will count.

7. The frequency counter as set forth in claim 1 wherein the detecting means comprises:
    means for counting the number of occurrences the preset maximum count is exceeded; and
    means for generating an overflow bit which indicates that the preset maximum count has been exceeded.

8. The frequency counter as set forth in claim 1 the count generated by the generating means comprises a plurality of binary coded decimal digits and wherein the displaying means comprises:
    a seven segment decoder driver;
    means for feeding each of the binary coded decimal digits from the storing means to the seven segment decoder driver; and
    means for strobing the displaying means to facilitate the visual indication of each of the binary coded decimal digits.

9. A frequency counter, which comprises:
    a plurality of input channels;
    means for feeding a plurality of analog frequency signals through the plurality of input channels;
    means for converting each of the plurality of analog frequency signals into digital frequency signals;
    means for assigning a sign bit to each of the plurality of digital frequency signals;
    means for establishing an order within which the plurality of digital frequency signals are to be measured;
    means for combining the frequency signals in the order generated by the establishing means and in response to the sign bit associated with each of the digital frequency signals;
    a plurality of binary coded decimal counters which are capable of counting in an up direction or a down direction;
    means, responsive to the assignment of the sign bit, for determining which direction the plurality of counters will count;
    means for enabling the plurality of counters during a first gate time to develop decimal count which represents the frequency of the frequency signals combined by the combining means;
    means for storing the binary coded decimal count developed by the plurality of counters;
    means for detecting whether the count developed by the plurality of counters has reached a preset maximum count;

means, responsive to the detection of a count which exceeds the preset maximum count, for changing to a second gate within which the plurality of counters are enabled; and means for displaying the count stored in the storing means as a representation of the frequency measured.

10. The frequency counter as set forth in claim 9 which further comprises:

means for blanking leading zeros which are a part of the count in the displaying means;

means for establishing a reference frequency; and means for positioning a decimal point within the representation of the frequency measured which is displayed by the displaying means.

11. The frequency counter as set forth in claim 9 wherein the detecting means comprises:

means for counting the number of occurrences the preset maximum count is exceeded; and means for generating an overflow bit which indicates that the preset maximum count has been exceeded.

12. The frequency counter as set forth in claim 9 wherein the displaying means comprises:

a seven segment decoder driver;

means for feeding each of the binary coded decimal digits from the storing means to the seven segment decoder driver; and means for strobing the displaying means to facilitate the visual indication of each of the binary coded decimal digits.

* * * * *